United States Patent [19]

Wysocki et al.

[11] Patent Number: 5,069,743
[45] Date of Patent: Dec. 3, 1991

[54] ORIENTATION CONTROL OF FLOAT-ZONE GROWN TIC CRYSTALS

[75] Inventors: Joseph A. Wysocki, Oxnard; Frans G. Krajenbrink, Newbury Park, both of Calif.

[73] Assignee: Hughes Aircraft Company, Los Angeles, Calif.

[21] Appl. No.: 508,137

[22] Filed: Apr. 11, 1990

[51] Int. Cl.[5] .............................................. C30B 13/00
[52] U.S. Cl. .......................... 156/620.7; 156/620.72; 156/620.73; 156/620.74; 156/620.75; 156/DIG. 68; 156/DIG. 75
[58] Field of Search ........... 156/620.7, 620.72, 620.73, 156/620.74, 620.75, DIG. 68, DIG. 75

[56] References Cited

U.S. PATENT DOCUMENTS 3,194,691 7/1965 Dikhoff ............................ 156/620.7
4,556,448 12/1985 Kim et al. .............................. 156/605

FOREIGN PATENT DOCUMENTS 3256598 10/1988 Japan ................................ 156/620.7

OTHER PUBLICATIONS

*Solid State Physics* (Japan); vol. 10, No. 1 (Jan. 1975).

S. Otani, T. Tanaka and Y. Ishizawa, *I. Crystal Growth* 83 (1987) P. 481.

S. Otani, T. Tanaka, S. Honma, and Y. Ishizawa, *Journal of Crystal Growth*; 61 (1981) p. 1.

S. Otani, T. Tanaka and Y. Ishizawa, *Journal of Crystal Growth*; 66 (1984) p. 419.

"Control of Heat Flow to Feed Rod in Floating Zone System" by S. Otani, et al., *Journal of Crystal Growth* 87 (1988) pp. 175-179.

"The Crystal Growth of the Transition Metal Compounds TiC, TiN, and ZrN by a Floating Zone Technique" by A. Christensen, *Journal of Crystal Growth* 33 (1976) pp. 99-104.

*Primary Examiner*—Olik Chaudhuri
*Assistant Examiner*—Felisa Garrett-Meza
*Attorney, Agent, or Firm*—Paul M. Coble; W. K. Denson-Low

[57] ABSTRACT

A process is provided for the controlled growth of titanium carbide. Essentially, relatively fast, or low temperature growth, favors growth of single crystals having (100) orientation, while relatively slow, or high temperature growth, favors single crystals having (111) orientation. The process obviates the need for any seed crystals and permits growth of rods having diameters exceeding 1 cm.

11 Claims, 1 Drawing Sheet

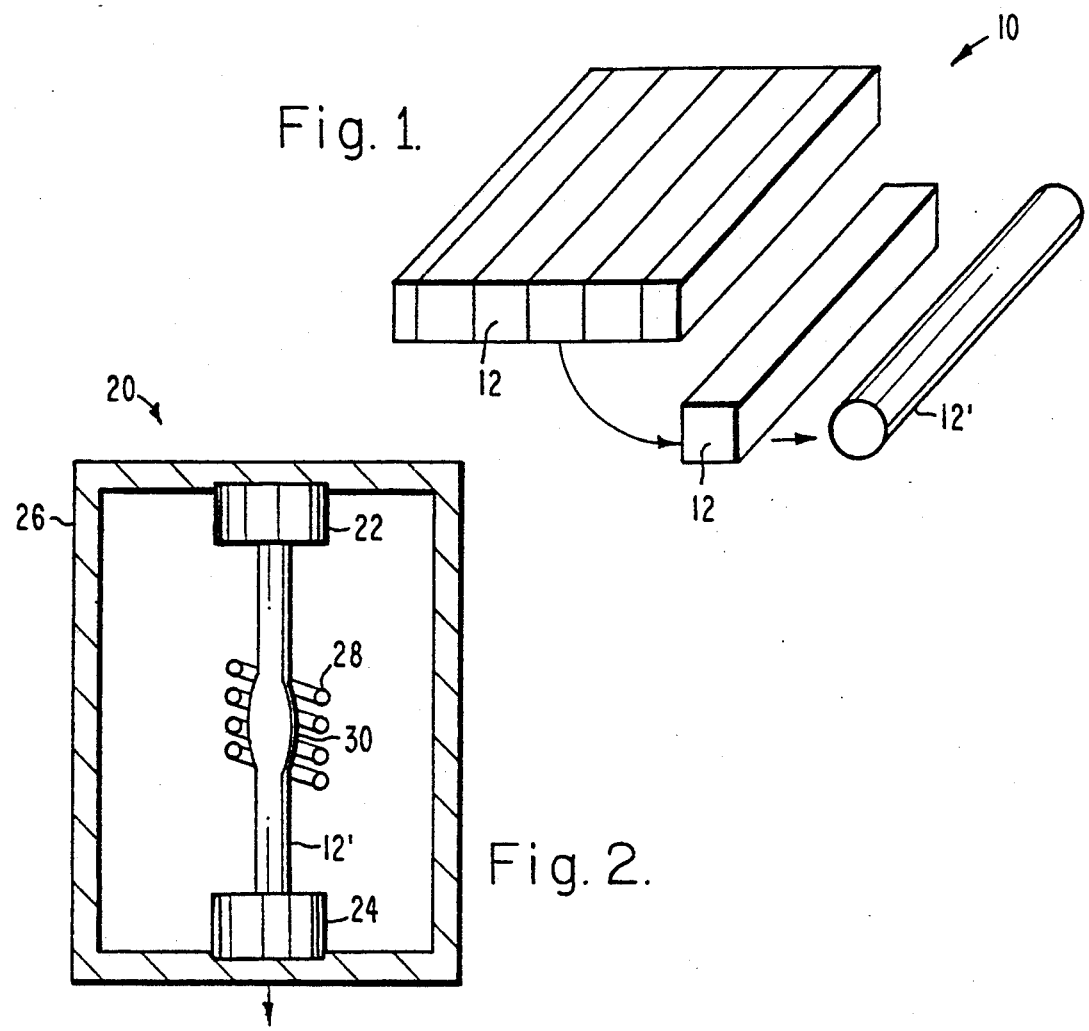
Fig. 1.
Fig. 2.
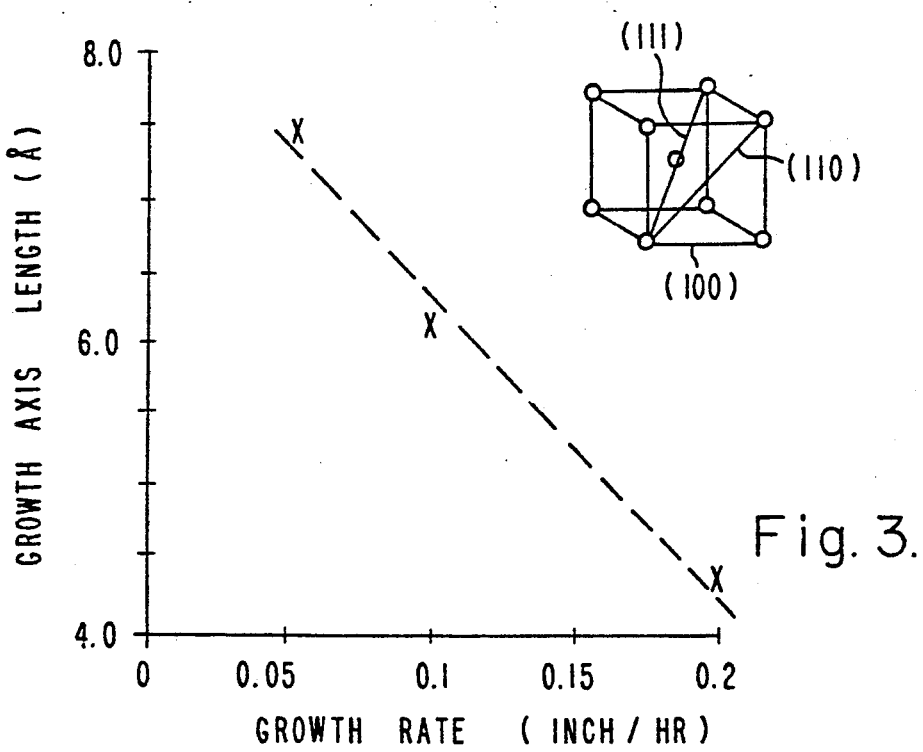
Fig. 3.

ORIENTATION CONTROL OF FLOAT-ZONE GROWN TiC CRYSTALS

BACKGROUND OF THE INVENTION

1. Field of the Invention

The present invention relates to the growth of single crystals of titanium carbide (TiC), and, more particularly, to the control of speed and temperature during single crystal fabrication.

2. Description of Related Art

Transition metal carbides and nitrides have been the subject of previous investigations because of their appreciable thermal and electrical conductivity combined with their high melting temperatures. Of these materials, TiC has been the most extensively investigated.

Fabrication of TiC ingots greater than 18 mm in diameter is being pursued for use as a substrate material for epitaxial growth of beta-silicon carbide ($\beta$-SiC) by metal organic chemical vapor deposition (MOCVD). The thermal conductivity, thermal expansion coefficient, and lattice parameters of TiC are suitably matched to $\beta$-SiC to make it an attractive substrate material. However, for use as a substrate for $\beta$-SiC device fabrication, it is necessary to grow single crystals of specified orientations and with diameters in excess of 50 mm.

Reported values of the melting temperature of TiC range from a low of about 3,067° C. to a high of 3,150° C. In addition, Ti, C, and TiC are all reactive species, both with ambient gases and with most solid crucible materials. The combination of temperature and reactivity limit the possible methods for handling the melt. The two most viable approaches are skull melting and float zoning. Float zoning is the preferred technique because a limited amount of material is melted at any one time. Hence, volatilization during melting is minimized.

The growth of TiC using a float-zone technique is known; see, e.g. Journal of Crystal Growth, Vol. 33, pp. 99-104 (1976) and Journal of Crystal Growth, Vol. 87, pp. 175-179 (1988). However, growth of TiC by prior art approaches appears to be limited to ingots of approximately 10 mm in diameter and uses conventional "seeding" techniques. However, for larger diameters, high quality TiC single crystal of suitable size and orientation are not available for seeding.

SUMMARY OF THE INVENTION

In accordance with the invention, a process is provided for the controlled growth of TiC. Essentially, relatively fast, or low temperature growth, favors growth of single crystals having (100) orientation, while relatively slow, or high temperature growth, favors single crystals having (111) orientation.

Variations in growth speed and temperature also result in changes of composition in the ingot, with accompanying changes in crystal orientation. Changes in composition are known to affect the lattice parameter of TiC. In contrast, here, changes in growth conditions are controlled, to effect changes in lattice parameter and composition and to modify single crystal orientation.

BRIEF DESCRIPTION OF THE DRAWING

FIG. 1 is a perspective view of a plate of TiC following hot-pressing and indicating the formation of an ingot;

FIG. 2 is a schematic view of a rod, formed from the ingot, in a float-zone chamber; and FIG. 3, on coordinates of growth axis length (in Ångstroms) and growth rate (in inches/hr), is a plot of the dependency of crystallographic orientation of TiC as a function of translation rate.

DESCRIPTION OF THE PREFERRED EMBODIMENTS

Large scale integration (LSI) processes require substrates having finite shapes with specific tolerances. It is desired to grow a substrate in the shape of a round disk, long boule, having the desired crystallographic orientation. The substrate would then be sliced perpendicular to the long axis.

Heretofore, it has not been possible to initiate growth of a single crystal rod or boule of TiC having a diameter greater than about 18 mm, due to the fact that a starting rod of the proper orientation and size is required, which is simply not available, either by crystal growth or by machining. In the latter case, TiC is too hard and brittle to work with.

In accordance with the invention, we have discovered that varying the growth parameters, namely, growth rate and growth temperature, permit varying the crystallographic orientation from (100) to (111). In particular, these parameters may be controlled to optimize orientation.

The process starts with TiC$_{0.9}$ powder, typically about 325 mesh, but in any event not larger than about 200 mesh, due to considerations related to compositional uniformity and porosity of the resulting crystal.

The powder is hot-pressed to establish a uniform density, typically at least about 90% of theoretical. Typically, hot-pressing is done at about 2,100° C. for several hours to form a plate. The details of the hot-pressing do not form a part of this invention, and are the subject of U.S. Pat. No. 4,857,249, issued Aug. 15, 1989, and commonly owned.

FIG. 1 is a perspective view of the plate 10 formed by the hot-pressing. A compact 12 is cut from the plate, and is oriented such that its long axis is used in growth.

The compact 12 is ground to form a rod 12', ranging in diameter from about 6 to 40 mm diameter, for example, about 15 mm diameter, and about 6 inches long. The length is limited by travel of the growth rod in the furnace.

The compound TiC is a non-congruently melting composition. In addition, the vapor pressure of Ti, C, and TiC must be considered, as discussed above. Experimental evidence has shown that the composition of any starting material will become progressively more carbon deficient during the float zoning. For this reason, it is necessary to start with materials that are high in carbon and allow the float zone process to stabilize at the correct C/Ti ratio.

As a consequence, starting material of 99.9% pure, commercially available TiC powder with a starting composition of Ti$_{0.52}$C$_{0.48}$ ($\approx$TiC$_{0.9}$) is used.

Referring now to FIG. 2, the rod is placed in a high pressure float zone chamber, or furnace, 20 and a vacuum is pulled with a roughing pump (not shown) to a pressure of about 1 to 10 microns. The chamber is then back-filled with at least about 400 psi of an inert gas, such as argon, neon or helium. This is to compensate for the high vapor pressure of titanium. Argon and neon are preferred, since helium has a high thermal conductivity and thus large thermal gradients are often obtained. However, argon tends to arc at high temperatures and high electric potential, and thus may not be as desirable as neon. Other gases, such as nitrogen and forming gas may alternatively be employed, so long as they do not react with the melt or, if reaction occurs, is favorable to the melt.

The preferred back-fill pressure is about 600 psi, although higher pressures may be used to control crystallographic orientation in conjunction with other parameters, such as temperature and rod translation rate, as described below.

The rod 12' is rotated at a rate of about 0.5 to 10 rpm. No rotation provides a crystal with an extremely thick polycrystalline surface skin during growth, and results in the preferential loss of one element, which becomes significantly more pronounced as the process continues. This reduces the amount of usable crystalline material. The rotation of the rod 12' during float zoning provides a continuous compositional averaging, and thereby, the marked loss of one element from the surface becomes less severe. At a rate greater than about 10 rpm, the stability of the melt becomes a problem.

The rod 12' is rotated by clamping the top and bottom thereof to individual motors 22, 24, which are preferably ganged together to reduce the possibility of shear of the molten portion of the rod. The clamping of the rod and mechanical connection to motors is well-known in crystal growth.

The rod 12' and motors 22, 24 are gripped in a translation frame 26 such that the rod is oriented vertically. The translation frame 26 moves the rod 12' downwardly. A heater comprising a radio frequency coil 28 surrounds the rod 12' and heats a portion of the length of the rod throughout its diameter. When a high rf power is applied to the coil 28, the portion of the rod 12' within the coil is heated to a sufficiently high temperature to form a molten zone 30.

After the molten zone 30 is established at one end of the rod 12', typically the top end, the rod is moved downwardly relative to and through the coil 28 by movement of the translation frame 26 to propagate the molten zone along the length of the rod. Alternatively, the coil could be moved upwardly to attain the relative motion, or the relative motion could be so as to move the rod upwardly with respect to the coil.

The coil 28, which typically comprises water-cooled copper tubing about ¼ inch OD, is wound to provide a molten zone of about 0.5 inch. The ratio of the length of the melt zone 30 to the diameter of the rod 12' is about 1:1, but in any event does not exceed about 1:2. The melt volume is defined as the largest volume (at the required temperature) that can still be constrained by the surface tension of the liquid and the electric field of the coil.

It is desired to provide uniform melting along the rod 12'. This is accomplished by substantially uniform rotation and translation of the rod and by applying substantially constant power to the coils 30.

The temperature of the melt is maintained above about 3,000° C. The higher the temperature, the lower the surface tension. However, melt balance considerations will dictate the optimum temperature employed for a given mass of melt.

The rf field to generate the necessary melt temperature is typically about 250 kHz. A 100 kV Lepel generator, available from Lepel Corp. (Edgewood, NY), is conveniently employed.

Growth conditions must be established, in order to grow TiC crystals having the desired properties. These growth conditions are dictated by a number of considerations. For example, due to the evaporation of titanium, it is desired to start the melt process at a relatively low temperature, then increase to a higher temperature as titanium stops evaporating. In practice, one starts at a lower rf power, observes a "fog" of vaporized titanium (which exists for some hours), and then increases power as the fog disappears.

As a result of starting the melt process at a lower temperature, it will be necessary to discard the upper part of the ingot, since it will be polycrystalline throughout and have a different stoichiometry than the rest of the ingot. An equilibrium is achieved at some point in the process, and simple structural analysis along the ingot, using X-ray diffraction, will establish that point. Typically, about one-half of the ingot is useful, due to the constraints of the particular growth apparatus employed herein. Apparatus permitting growth of longer ingots would result in a higher percent of useful ingot material.

As indicated above, once the power is applied to the rf coil 28 to achieve melting in the melt zone 30 of the rod 12', the rod is translated relative to the coil. Once the rod has traversed the coil, the resulting ingot is then cooled.

In accordance with the invention, the crystal structure is controlled by controlling the growth parameters, specifically, temperature (power to the coils) and rod translation.

As indicated above, the temperature is fixed by the balance of the melt mass and the surface tension, and in any event is higher than the melting temperature of the material (as perceived visually) and lower than a temperature that would cause catastrophic separation of the melt from the solid. This is accomplished by simple trial and error experimentation. The temperature determined is for a particular rod size, rotation rate, translation rate, and gas pressure.

The crystallographic orientation of the ingot is found to depend on the translation rate of the ingot. Specifically, at a temperature greater than about 3,100° C. and a pressure in the furnace of about 600 psi, a translation rate of about 0.05 inch/hr results in a crystallographic orientation of (111) perpendicular to the growth axis, while a translation rate of about 0.2 inch/hr results in a crystallographic orientation of (100) perpendicular to the growth axis. A crystallographic orientation of (110) is achieved with a translation rate of about 0.1 inch/hr. FIG. 3 depicts the relationship between the translation rate and the resulting crystallographic orientation.

TiC has a body centered cubic (BCC) structure, with a $=4.33$ Å, and is electrically conductive. Thus, it is important to insulate the ends of the rod from the clamps. This also provides thermal insulation by keeping the rod ends from conducting heat away from the melt zone. The use of thermal insulation provides a sharp gradient between the rod and the melt. Further, the thermal insulation permits a higher temperature in the melt, which would in turn permit a faster translation rate of the rod to achieve the same crystal orientation. For example, for an increase of about 15% in the growth temperature, the translation rate would also increase by about 15% to achieve the same crystallographic orientation, at stable growth conditions. Thus, the values given above for translation rate may be varied by about $\pm 15\%$ for the range of temperature likely to be employed, and the term "about" is used with respect to the translation rate to indicate the extent of that variance.

In FIG. 3, it is seen that as the spacing between planes becomes larger, the growth rate must be slowed down to achieve that orientation. The Figure is based on observed data and indicates the trend of changing growth speed to attain a desired crystallographic orientation.

The titanium carbide ingot may be sliced to form wafers. Growth of SiC on a major surface of a single crystalline TiC wafer may be done by metalorganic chemical vapor deposition (MOCVD) to form a layer of β-SiC of about 1 to 10 μm thick. Such layers of SiC are single crystalline, as determined by SEM and electron channeling.

As is known, there is a lattice mismatch of about 0.7% between the two materials, and the coefficient of thermal expansion of SiC is about 30% less than that of TiC.

Thus, there has been disclosed a method of growing single crystal ingots of TiC from polycrystalline rods in a float-zone apparatus, in which the crystallographic orientation may be altered by controlling the temperature of the melt zone and the translation rate of the polycrystalline rod. It will be apparent to those skilled in the art that various changes and modifications of an obvious nature may be made, and all such changes and modifications are considered to fall within the scope of the invention, as defined by the appended claims.

What is claimed is:

1. A process of growing single crystal titanium carbide ingot in a high pressure furnace by float-zone to establish a melt zone in a titanium carbide rod by an rf field and translating said rod relative to said field, said process comprising (a) translating said rod in an inert atmosphere of at least about 400 psi, (b) rotating said rod about its growth axis at a rate ranging from about 0.5 to 10 rpm, and (c) controlling the crystallographic orientation of said single crystal titanium carbide by controlling the temperature of said melt zone and the translation rate of said rod, said translation rate ranging from about 0.05 to 0.2 inch/hr.

2. The process of claim 1 wherein said atmosphere is at least about 600 psi.

3. The process of claim 1 wherein said inert atmosphere is selected from the group consisting of argon, neon, helium, nitrogen, and forming gas.

4. The process of claim 1 wherein at a temperature of at least about 3,100° C., the crystallographic orientation of said single crystal along the direction of growth depends on the translation rate as follows:

| (111) | about 0.05 inch/hr |
| (110) | about 0.1 inch/hr |
| (100) | about 0.2 inch/hr. |

5. A process of growing single crystal titanium carbide ingot in a high pressure furnace by float-zone to establish a melt zone in a titanium carbide rod by an rf field and translating said rod relative to said field comprising:
   (a) providing a compact of polycrystalline TiC in the shape of a rod;
   (b) providing an rf coil surrounding said rod in which said rf field is established to form said melt zone;
   (c) clamping the ends of said rod to means for rotating said rod;
   (d) providing a pressure of at least about 400 psi in said furnace with an inert gas;
   (e) rotating said rod;
   (f) energizing said rf coil to provide a temperature of at least about 3,000° C. in said melt zone; and
   (g) initiating said translation at a rate ranging from about 0.05 to 0.2 inch/hr.

6. The process of claim 5 wherein said inert gas is selected from the group consisting of argon, neon, helium, nitrogen, and forming gas.

7. The process of claim 5 wherein at a temperature of at least about 3,100° C. and a pressure of about 600 psi, the crystallographic orientation of said single crystal along the direction of growth depends on the translation rate as follows:

| (111) | about 0.05 inch/hr |
| (110) | about 0.1 inch/hr |
| (100) | about 0.2 inch/hr. |

8. The process of claim 5 wherein said rod is rotated at a rate of about 0.5 to 10 rpm.

9. A process for growing single crystal titanium carbide ingot in a high pressure furnace by float-zone to establish a melt zone in a titanium carbide rod by an rf field and translating said rod relative to said field comprising:
   (a) providing a compact of polycrystalline titanium carbide powder in the shape of a rod, said rod formed by a process which comprises (1) hot-pressing titanium carbide powder to form a plate having a substantially uniform density and at least about 90% theoretical density, (2) slicing said plate to form at least one ingot therefrom, and (3) grinding said ingot to form said melt zone in said rod;
   (b) providing an rf coil surrounding said rod in which said rf field is established to form said melt zone in said rod;
   (c) clamping the ends of said rod to means for rotating said rod;
   (d) providing a pressure of at least about 400 psi in said furnace with an inert gas;
   (e) rotating said rod at a predetermined rate ranging from about 0.5 to 10 rpm;
   (f) energizing said rf coil to provide a temperature of at least about 3,100° C. in said melt zone; and
   (g) initiating said translation at a rate ranging from about 0.05 to 0.2 inch/hr, wherein the crystallographic orientation of said single crystal along the direction of growth depends on the translation rate as follows:

| (111) | about 0.05 inch/hr |
| (110) | about 0.1 inch/hr |
| (100) | about 0.2 inch/hr. |

10. The process of claim 9 wherein said inert gas is selected from the group consisting of argon, neon, helium, nitrogen, and forming gas.

11. The process of claim 9 wherein said titanium carbide consists essentially of $TiC_{0.9}$.

* * * * *

UNITED STATES PATENT AND TRADEMARK OFFICE
CERTIFICATE OF CORRECTION

PATENT NO. : 5,069,743

DATED : DECEMBER 3, 1991

INVENTOR(S) : JOSEPH A. WYSOCKI, et al.

It is certified that error appears in the above-identified patent and that said Letters Patent is hereby corrected as shown below:

Col. 5, line 57, delete "of" and insert --for--.

Col. 6, line 46, delete "predetermined".

Signed and Sealed this

Second Day of November, 1993

Attest:

Attesting Officer

BRUCE LEHMAN

Commissioner of Patents and Trademarks